(12) United States Patent
Di Vincenzo et al.

(10) Patent No.: US 11,756,602 B2
(45) Date of Patent: Sep. 12, 2023

(54) SENSING COMPONENT WITH A COMMON NODE

(71) Applicant: Micron Technology, Inc., Boise, ID (US)

(72) Inventors: Umberto Di Vincenzo, Capriate San Gervasio (IT); Michele Maria Venturini, Milan (IT)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 17/646,261

(22) Filed: Dec. 28, 2021

(65) Prior Publication Data

US 2023/0206979 A1 Jun. 29, 2023

(51) Int. Cl.
*G11C 11/22* (2006.01)
*G11C 16/28* (2006.01)
*G11C 16/04* (2006.01)

(52) U.S. Cl.
CPC ........ *G11C 11/2273* (2013.01); *G11C 11/221* (2013.01); *G11C 16/0483* (2013.01); *G11C 16/28* (2013.01)

(58) Field of Classification Search
CPC ... G11C 11/2273; G11C 11/221; G11C 16/28; G11C 11/4091
See application file for complete search history.

(56) References Cited

U.S. PATENT DOCUMENTS 11,244,739 B2 * 2/2022 Di Vincenzo .......... G11C 29/44

* cited by examiner

*Primary Examiner* — Kretelia Graham
(74) *Attorney, Agent, or Firm* — Holland & Hart LLP

(57) ABSTRACT

Methods, systems, and devices for sensing component with a common node are described. A set of sense circuits of a memory device may include a shared differential amplifier having a first branch for each sense circuit and a shared second branch, as well as a shared common node. A respective latch of each sense amplifier may be initialized to a second logic state, and the common node may undergo a voltage ramp to determine the state stored in the memory cell. If the memory cell stores the first logic state, the sense amplifier may couple with the common node to draw the current and switch the state of the latch to the first logic state. Alternatively, if the memory cell stores the second logic state the current may not be drawn and the state of the latch may not switch.

25 Claims, 6 Drawing Sheets

SENSING COMPONENT WITH A COMMON NODE

FIELD OF TECHNOLOGY

The following relates generally to one or more systems for memory and more specifically to sensing component with a common node.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
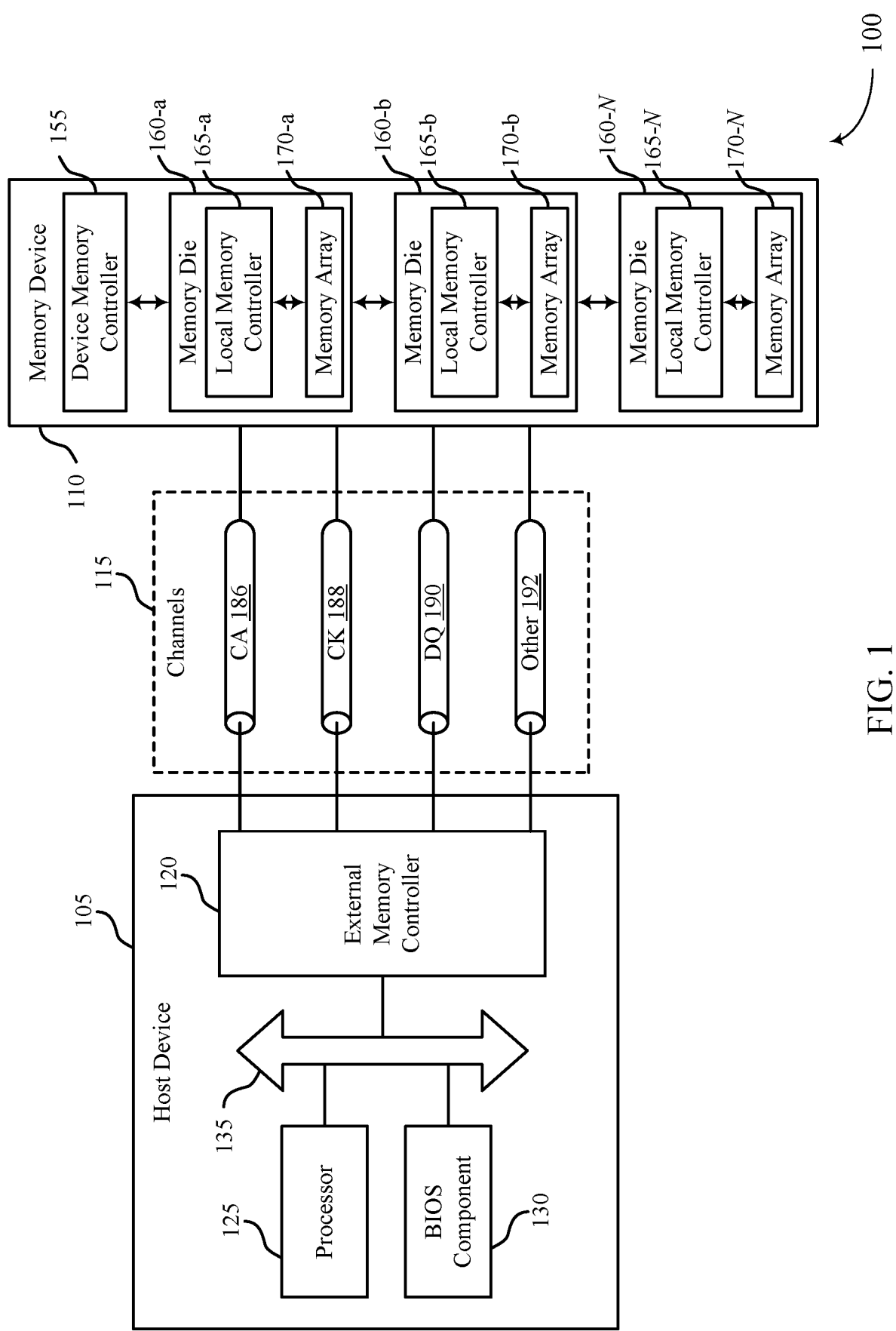
FIG. 1 illustrates an example of a system that supports sensing component with a common node in accordance with examples as disclosed herein.

A memory device (e.g., an FeRAM device or a NAND device) may perform a sense operation to determine a set of logic states stored in a corresponding set of memory cells, such as a codeword. For example, the sense operation may use a set of sense amplifiers respectively coupled with the set of memory cells to determine each bit (e.g., a logic "1" or a logic "0") of the codeword. In some cases, if a sense amplifier detects a logic state, the sense amplifier may draw a current (e.g., a tail current) to store the first state in a temporary register, such as a latch. Accordingly, each sense amplifier may include a respective branch or circuitry to provide the current used to sense the logic state. However, if the codeword includes a significant quantity of bits of the second logic state, the current provided to the sense amplifiers used to detect the second logic state may be unused or may inefficiently increase current consumption, which may increase system latency and power consumption. Accordingly, methods to improve efficiency of a sense operation may be desired.

As disclosed herein, a set of sense circuits of a memory device may share portions of a differential amplifier to increase the reliability and efficiency of access operations of a memory cell storing a first logic state (e.g., a logic "1") or a second logic state (e.g., a logic "0"). For example, each sense circuit may include a respective first branch of the shared differential amplifier, and may share a common second branch of the shared differential amplifier. In some cases, the set of sense circuits may also include a shared common node, which may be selectively coupled with the respective first branch of each sense circuit. Additionally, each sense circuit may include a transistor coupled with the common node to draw a current (e.g., a tail current) as part of detecting the first logic state. For example, as part of the access operation, a respective latch of each sense circuit may be initialized to the second logic state, and the common node may undergo a voltage ramp to determine the state stored in the memory cell using a voltage of a digit line coupled with a memory cell and a sense circuit. If the memory cell stores the first logic state and the voltage of the common node falls below a threshold of a transistor positioned between the first branch and the common node, the first branch of the sense circuit may electrically couple with the common node and allow the current to flow to the first branch, which may activate a gate of a set transistor for the latch. Accordingly, the set transistor may switch the state of the latch to the first logic state. Alternatively, if the memory cell stores the second logic state, the voltage of the common node may not fall below the voltage of the digit line, which may fail to activate the set transistor and the state of the latch may not switch. Thus, the second branch of the differential amplifier shared among the set of sense circuits may reduce current consumption and accordingly improve efficiency of a sense operation.

Features of the disclosure are initially described in the context of systems and dies as described with reference to FIGS. 1 and 2. Features of the disclosure are described in the context of a sense circuit and a timing diagram as described with reference to FIGS. 3-4. These and other features of the disclosure are further illustrated by and described with reference to an apparatus diagram and flowcharts that relate to sensing component with a common node as described with reference to FIGS. 5-6.

FIG. 1 illustrates an example of a system 100 that supports sensing component with a common node in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160a, memory die 160b, memory die 160N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, a set of sense amplifiers of a memory array 170 may include a respective first branch of a shared differential amplifier, and may share a common second branch of the shared differential amplifier. In some cases, the set of sense circuits may also include a shared common node, which may be selectively coupled with the respective first branch of each sense circuit. Additionally, each sense circuit may include a transistor coupled with the common node to draw a current (e.g., a tail current) as part of detecting the first logic state. For example, as part of the access operation, a respective latch of each sense circuit may be initialized to the second logic state, and the common node may undergo a voltage ramp to determine the state stored in the memory cell using a voltage of a digit line coupled with a memory cell and a sense circuit. If the memory cell stores the first logic state and the voltage of the common node falls below a threshold of a transistor positioned between the first branch and the common node, the first branch of the sense circuit may electrically couple with the common node and allow the current to flow to the first branch, which may activate a gate of a set transistor for the latch. Accordingly, the set transistor may switch the state of the latch to the first logic state. Alternatively, if the memory cell stores the second logic state, the voltage of the common node may not fall below the voltage of the digit line, which may fail to activate the set transistor and the state of the latch may not switch. Thus, the second branch of the differential amplifier shared among the set of sense circuits may reduce current consumption and accordingly improve efficiency of a sense operation.

Figure 2:
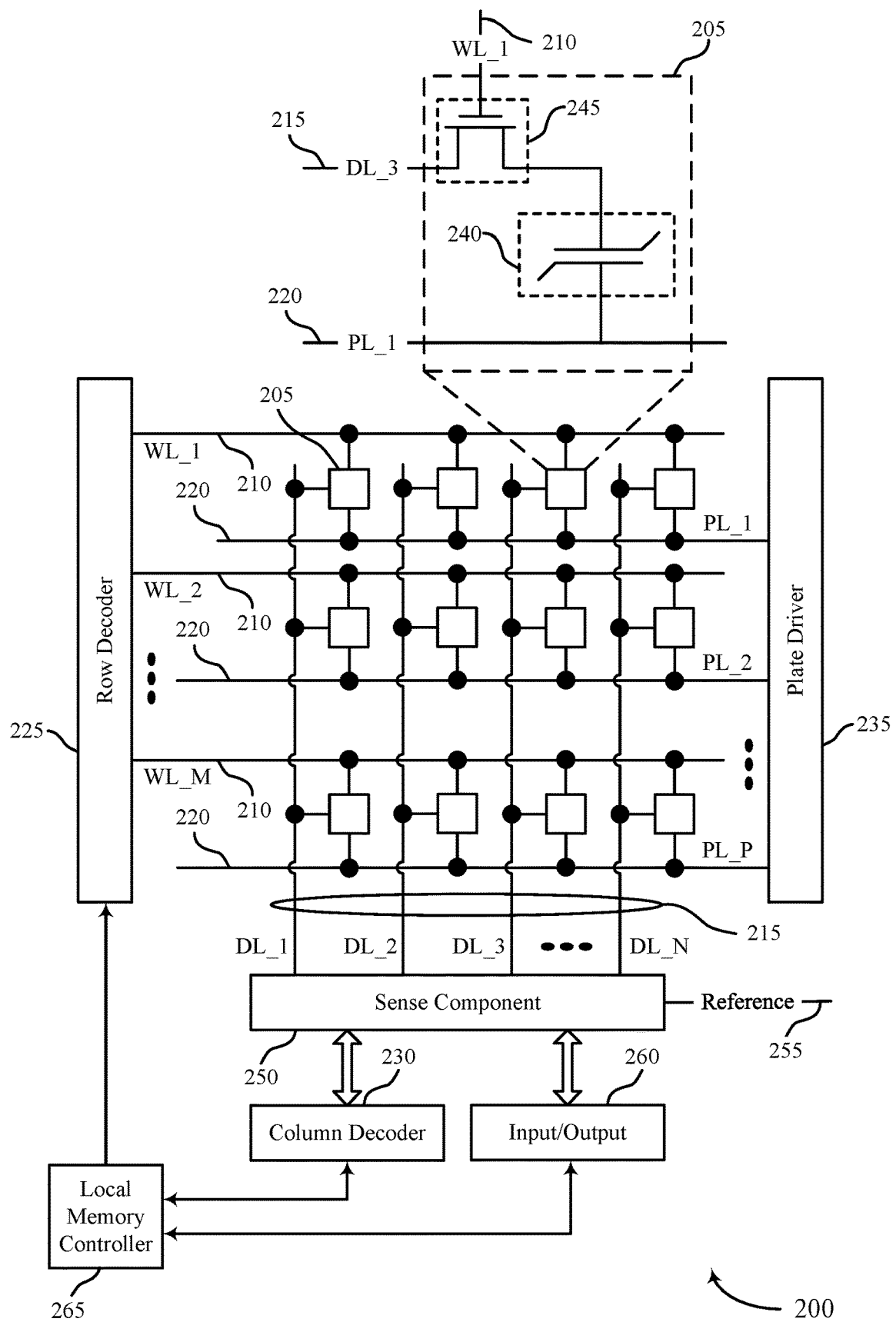
FIG. 2 illustrates an example of a memory die that supports sensing component with a common node in accordance with examples as disclosed herein.

FIG. 2 illustrates an example of a memory die 200 that supports sensing component with a common node in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

In some cases, the sense component 250 may include a set of sense circuits respectively coupled with the digit lines 215. The set of sense circuits of a sense component 250 may include a respective first branch of a shared differential amplifier, and may share a common second branch of the shared differential amplifier. In some cases, the set of sense circuits may also include a shared common node, which may be selectively coupled with the respective first branch of each sense circuit. Additionally, each sense circuit may include a transistor coupled with the common node to draw a current (e.g., a tail current) as part of detecting the first logic state. For example, as part of the access operation, a respective latch of each sense circuit may be initialized to the second logic state, and the common node may undergo a voltage ramp to determine the state stored in a memory cell 205 using a voltage of a digit line 215 coupled with the memory cell 205 and a sense circuit. If the memory cell 205 stores the first logic state and the voltage of the common node falls below a threshold of a transistor positioned between the first branch and the common node, the first branch of the sense circuit may electrically couple with the common node and allow the current to flow to the first branch, which may activate a gate of a set transistor for the latch. Accordingly, the set transistor may switch the state of the latch to the first logic state. Alternatively, if the memory cell 205 stores the second logic state, the voltage of the common node may not fall below the voltage of the digit line, which may fail to activate the set transistor and the state of the latch may not switch. Thus, the second branch of the differential amplifier shared among the set of sense circuit may reduce current consumption and accordingly improve efficiency of a sense operation.

Figure 3:
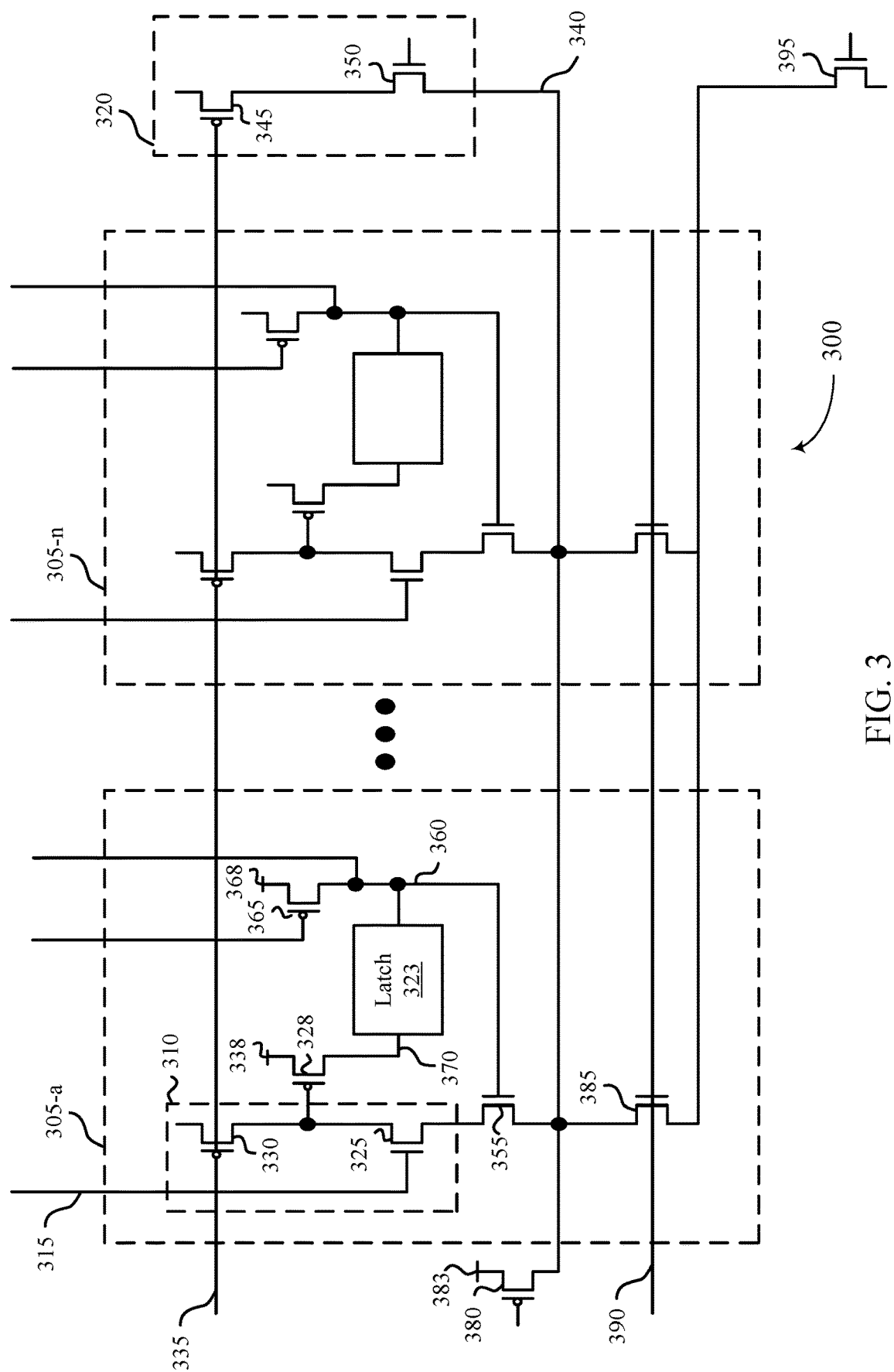
FIG. 3 illustrates an example of a sense circuit that supports sensing component with a common node in accordance with examples as disclosed herein.

FIG. 3 illustrates an example of a sense circuit 300 that supports sensing component with a common node in accordance with examples as disclosed herein. In some cases, the sense circuit 300 may include or may be included in the sense component 250 as described with reference to FIG. 2. The sense circuit 300 may include a plurality of sense amplifiers 305, such as the sense amplifier 305-a through the sense amplifier 305-n. Each sense amplifier 305 may be operable to determine a state stored in a memory cell coupled with a digit line 315, which may be an example of the digit line 215 as described with reference to FIG. 2. In some cases, the sense circuit 300 may be included in a memory device such as an FeRAM device or a NAND device. During a sense operation, the digit line may be biased to a first voltage if the memory cell stores a first state, or to a second voltage if the memory cell stores a second state. For example, the digit line may be coupled with the memory cell and a current may flow between the memory cell and the digit line. The magnitude of the current may depend on the state stored in the memory cell. Accordingly, the voltage of the digit line after being coupled with the memory cell may depend on the state stored in the memory cell. In some examples, the state of the memory cell may be sensed by a sense amplifier 305, for example using a differential amplifier, and stored in a respective latch 323.

In some cases, each sense amplifier 305 may include a respective first branch 310. The first branch may include a first transistor 325 having a gate coupled with the digit line 315. In some examples, the first transistor 325 may be an example of an n-type metal-oxide-semiconductor field-effect transistor (MOSFET). That is, the first transistor 325 may be configured to be activated (e.g., become conductive, electrically couple the source node and drain node) if a voltage difference between the gate of the first transistor 325 and a terminal of the first transistor 325 exceeds a threshold voltage. In some cases, the first branch 310 may include a second transistor 330 having a gate coupled with a first reference node 335, which may be set to a bias voltage by a biasing circuit (not shown). In some cases, the second transistor 330 may be an example of a p-type MOSFET. That is, the second transistor 330 may be configured to be activated (e.g., become conductive, electrically couple the source node and drain node) if a voltage difference between the gate of the first transistor 325 and a terminal (e.g., a source terminal or drain terminal) of the first transistor 325 is below a threshold voltage.

In some cases, the second transistor 330 may be configured to supply a current to the sense amplifier 305-a (e.g., to the first branch 310 of the sense amplifier 305-a). For example, a source terminal of the second transistor 330 may be coupled with a supply voltage. If the voltage difference between the first reference node 335 and a drain terminal of the second transistor is high (e.g., above the threshold voltage of the second transistor 330), a current may flow through the second transistor 330 to the first branch 310. In some example, the current supplied by the second transistor may be relatively small (e.g., around 10 nano-Amperes (nA)).

Additionally, the sense circuit 300 may include a second branch 320. The second branch 320 may be shared among the sense amplifiers 305, for example via a common node 340. In some examples, the second branch may include a third transistor 345, which may be an example of a p-type MOSFET, having a gate coupled with the first reference node 335. In some examples, a current supplied by the third transistor 345 may be larger than the current supplied by the second transistor 330. For example, the current supplied by the third transistor 345 may be approximately an integer multiple of the current supplied by the second transistor 330, where the integer multiple may be less than the quantity of sense amplifiers 305. In some cases, the integer multiple may depend on a quantity of sense amplifiers which may concurrently switch (e.g., statistically) from the first logic state to the second logic state. In some cases, the second branch 320 may include a fourth transistor 350 having a gate coupled with a reference voltage. That is, the first transistor 325 may be a first input transistor for a differential amplifier, while the fourth transistor 350 may be a shared second input transistor for the differential amplifier.

In some cases, each sense amplifier 305 may include a fifth transistor 355 to selectively couple the respective first branch 310 with the common node 340. For example, the respective first branch 310 and the common node 340 may be coupled with terminals of the fifth transistor 355, and a gate of the fifth transistor 355 may be coupled with a first node 360 of the latch 323. The fifth transistor 355 may be configured to be activated (e.g., to couple the first branch 310 with the common node 340) if the latch stores an initial state.

For example, a sixth transistor 365 may be configured to receive a reset or initialization signal to couple the first node 360 of the latch 323 with a supply voltage 368, which may activate the fifth transistor 355. In some cases, applying the reset or initialization signal may store the initial state in the latch 323. For example, in the initial state of the latch 323, the first node 360 of the latch may be set to the supply voltage 368. Additionally or alternatively, the fifth transistor 355 may be configured to isolate or decouple the first branch 310 from the second branch 320. In some examples, the latch 323 may be an example of a set of cross-coupled inverters. Accordingly, the initial state of the latch 323 may be stored (e.g., on the first node 360) until the state of the latch 323 is switched using the tenth transistor 328. Thus, if the state stored in the latch 323 switches, a voltage of the first node 360 may accordingly switch and the fifth transistor 355 may be deactivated, which may isolate or decouple the first branch 310 from the common node 340.

In some cases, if the voltage of the digit line 315 and the voltage of the common node 340 satisfy a threshold, the state of the latch 323 may switch (e.g., from the initial state to a second state). For example, during a sense operation, the common node 340 may be configured to undergo a voltage ramp, which may decrease (e.g., linearly) the voltage of the common node 340. If the difference of the voltage of the digit line 315 and the voltage of the common node 340 reach a threshold voltage (e.g., the threshold of the first transistor 325), the first transistor 325 may activate, which may in turn activate the tenth transistor 328. Activating the tenth transistor 328 may couple a second node 370 of the latch 323 with a supply voltage 338 to raise a voltage of the second node 370 (e.g., overdriving the transistor in the latch that maintains the latch in the initial state). Accordingly, the state of the latch 323 may switch, and the first branch 310 may be isolated or decoupled from the second branch 320. In some cases the latch 323 may include a set of cross-coupled inverters. Additionally, a pull-down transistor of the latch 323 may be smaller than a pull-up transistor (e.g., transistor 328) coupled with the first node 360 of the latch 323.

In some examples, the common node may be biased to an initial or starting voltage via a seventh transistor 380. For example, a gate of the seventh transistor 380 may be configured to receive an initialization or reset signal to activate the seventh transistor 380 and couple the common node 340 with a supply node 383 maintained at the initial voltage. In some cases, the initial voltage may be greater than the voltage of the digit line 315. After biasing the common node 340 to the initial voltage, the seventh transistor 380 may deactivate, and may cause the common node 340 to float. In some examples, the voltage ramp of the common node may result, at least in part, from a second current drawn from the common node 340 through an eighth transistor 385. For example, the third transistor 345 may supply a current to the common node 340, and the eighth transistor 385 may couple the common node 340 with a virtual ground voltage, for example through a ninth transistor 395 to draw a current (e.g., a tail current) from the common node 340. Further, a gate of the eighth transistor 385 may be coupled with a second reference node 390, which may, in some cases, control a magnitude of the second current. In some cases, the current transferred via each eighth transistor 385 may be greater than the current supplied via the third transistor 345 (e.g., around 2 micro Amperes (μA)). Additionally or alternatively, the voltage ramp of the common node 340 may be controlled via the reference voltage applied to the fourth transistor 350. For example, the current supplied by the third transistor 345 may be greater than the total current supplied by the eighth transistors 385 (e.g., the eight transistor 385 in each sense amplifier 305). Accordingly, if the voltage difference between the gate of the fourth transistor 350 and the common node 340 is greater than a threshold, the fourth transistor 350 will pull the common node 340 up to the threshold.

Figure 4:
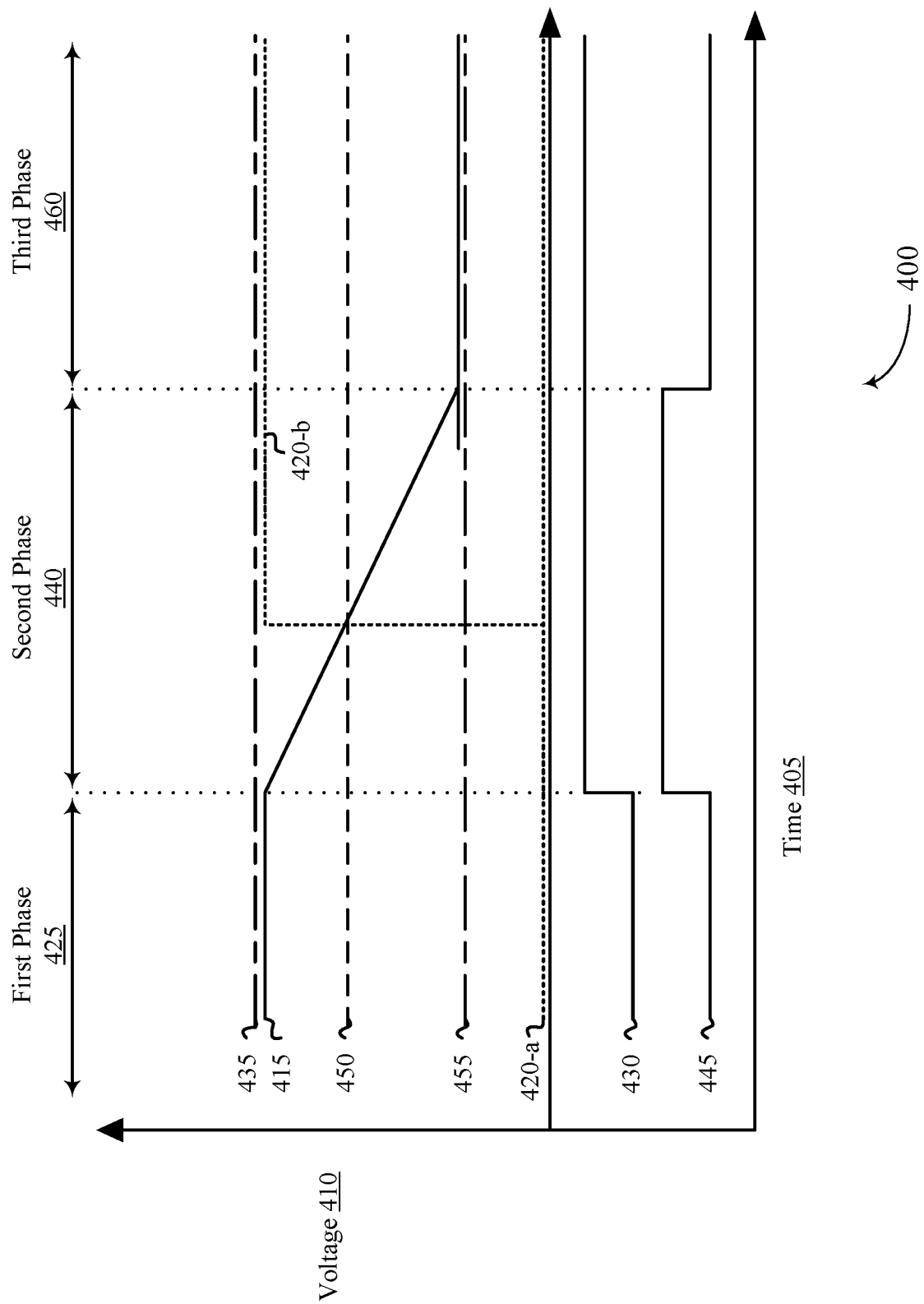
FIG. 4 illustrates an example of a timing diagram that supports sensing component with a common node in accordance with examples as disclosed herein.

FIG. 4 illustrates an example of a timing diagram 400 that supports sensing component with a common node in accordance with examples as disclosed herein. In some cases, the timing diagram 400 may be implemented by a circuit included in a memory device or memory system, such as the sense circuit 300 as described with reference to FIG. 3. The timing diagram 400 may illustrate a voltage 410 over a period of time 405 of one or more components or nodes of the sense circuit 300, such as a voltage of a common node 415, which may be an example of the common node 340 as described with reference to FIG. 3. Additionally, the timing diagram 400 may illustrate a voltage of a node of a latch 420-a, such as the second node 370 of the latch 323 as described with reference to FIG. 3. The timing diagram 400 may be used as part of a sense operation to determine one or more states stored in a corresponding one or more memory cells, such as a codeword.

In some cases, the timing diagram may include a first phase 425, which may be an example of an initialization phase. During the first phase 425, a reset signal 430 may initialize one or more components of the sense circuit 300. For example, the reset signal 430 may cause the sense circuit 300 to bias the voltage of the common node 415 to a first voltage 435, and may cause the latch 323 to store an initial value (e.g., a logic "0").

By way of example, the reset signal 430 may be activate the seventh transistor 380 to bias the voltage of the common node 415 to a first voltage 435. In some cases, activating the seventh transistor 380 may couple the common node 340 to the supply node 383, which may be held or maintained at the first voltage 435. Additionally, the reset signal 430 may activate the sixth transistor 365 to store the initial state in the latch 323, for example by coupling the first node 360 of the latch 323 with the supply voltage 368. Accordingly, the voltage of the first node 360 of the latch 323 may be high, which may activate the fifth transistor 355. Thus, as part of the first phase 425, the fifth transistor 355 may couple the first branch 310 with the common node 340 (e.g., by coupling the first transistor 325 with the common node 340). In some cases, during the first phase 425, the bias voltage of the first reference node 335 may activate the second transistor 330 to supply a first current to the first branch 310.

In some cases, the timing diagram 400 may include a second phase 440. During the second phase 440, the reset signal 430 may transition (e.g., from a low state to a high state). Accordingly, the common node 340 may be isolated from the supply node 383, and the voltage of the common node 415 may float (e.g., initially at the first voltage 435). Subsequently, the voltage of the common node 415 may begin to decrease or ramp down. In some examples, because the common node 340 may be shared among the plurality of sense amplifiers 305, each sense amplifier 305 may share the same voltage of the common node 415.

In some examples, the ramp of the voltage of the common node 415 may result, at least in part, from being coupled with a virtual ground. For example, as part of the second phase 440, a reference current signal 445 may become active (e.g., transition from a low state to a high state). The reference current signal 445 may be applied to the gate of the ninth transistor 395. Accordingly, activating the reference current signal 445 may activate the ninth transistor 395 to couple the common node 340 with the virtual ground. Thus, a current may be drawn from the common node 340 (e.g., via the eighth transistor 385) which may contribute to the ramp of the voltage of the common node 415. Additionally or alternatively, the ramp of the voltage of the common node 415 may result from a corresponding ramp of a reference voltage applied to the fourth transistor 350. For example, during the second phase 440, the reference voltage may ramp down to control a current drawn from the common node 340 through the third transistor 345. Accordingly, the voltage of the common node 415 may decrease along with the reference voltage.

In some cases, a voltage of the digit line 315 may correspond to a first logical value (e.g., a logic "1"). In such cases, during the second phase 440, the voltage of the common node 415 may reach a threshold voltage 450. The threshold voltage 450 may be a threshold below the voltage of the digit line 315 if the first state is stored. Thus, if the voltage of the common node 415 goes below the threshold voltage 450 (e.g., if the voltage difference between the common node 340 and the digit line 315 satisfies a threshold), the first transistor 325 may activate. Accordingly, the voltage of the node 370 of the latch 420-a may rise, for example to a high voltage 420-b, which may switch the state of the latch 323. Additionally, in response to state of the latch 323 being switched, the first node 360 of the latch 323 may rise, and the fifth transistor 355 may be deactivated to isolate the first branch 310 from the common node 340.

Additionally or alternatively, the voltage of the digit line 315 may correspond to a second logical value (e.g., a logic "0"). In such cases, the threshold voltage 450 may be below the final voltage of the common node 415 (e.g., the final voltage 455). Accordingly, the first transistor 325 may not activate and the voltage of the node of the latch 420-a may not transition to a high state. Thus, the state of the latch 323 may not switch, and so the second current may not be drawn through the fifth transistor 355.

In some examples, the sense circuit 300 and timing diagram 400 may be configured to determine multiple levels stored in a memory cell (e.g., more than two levels). For example, the sense circuit 300 may include additional circuitry corresponding to additional threshold voltages 450. Accordingly, the first transistor 325 may activate at a different threshold voltage 450 depending on the state stored in the memory cell. In some cases, the sense circuitry 300 may include multiple latches corresponding to the multiple levels, and the additional threshold voltages may correspond to transistors used to switch a respective state of the multiple latches. Thus, the voltage ramp may be used to determine one of multiple levels stored in the memory cell.

In some cases, during a third phase the ramp of the voltage of the common node 415 may end after the voltage of the common node 415 reaches a target voltage 455, which may correspond to an end of a read operation. In some cases, the target voltage 455 may correspond to a threshold voltage of the fourth transistor 350. Accordingly, after the voltage of the common node 415 reaches the target voltage 455, the fourth transistor 350 may deactivate, and the ramp of the voltage of the common node 415 may end. Additionally or alternatively, the ramp of the voltage of the common node 415 may end in response to the reference current signal 445 switching from a high state to a low state. For example, if the reference current signal 445 switches to a low state, the ninth transistor 395 may deactivate, which may isolate the common node 340 from the virtual ground. Accordingly, current may not be drawn from the common node 340 and the voltage of the common node 415 may be maintained at or near the target voltage 455.

In some examples, the codeword (e.g., the set of states stored in memory cells coupled with respective sense amplifiers 305) sensed using the timing diagram 400 may be an example of a balanced codeword. That is, the codeword may include approximately equal quantities of logic "1" states and logic "0" states. Accordingly, during the second phase 440, approximately half of the latches 323 of the plurality of sense amplifiers 305 may switch and draw the second current, while the other approximately half of the latches 323 may not switch. Thus, the tail current consumed by a sense circuit 300 operating according to the timing diagram 400 may be approximately half of the tail current consumed using a sense circuit which does not include the common node 340.

Figure 5:
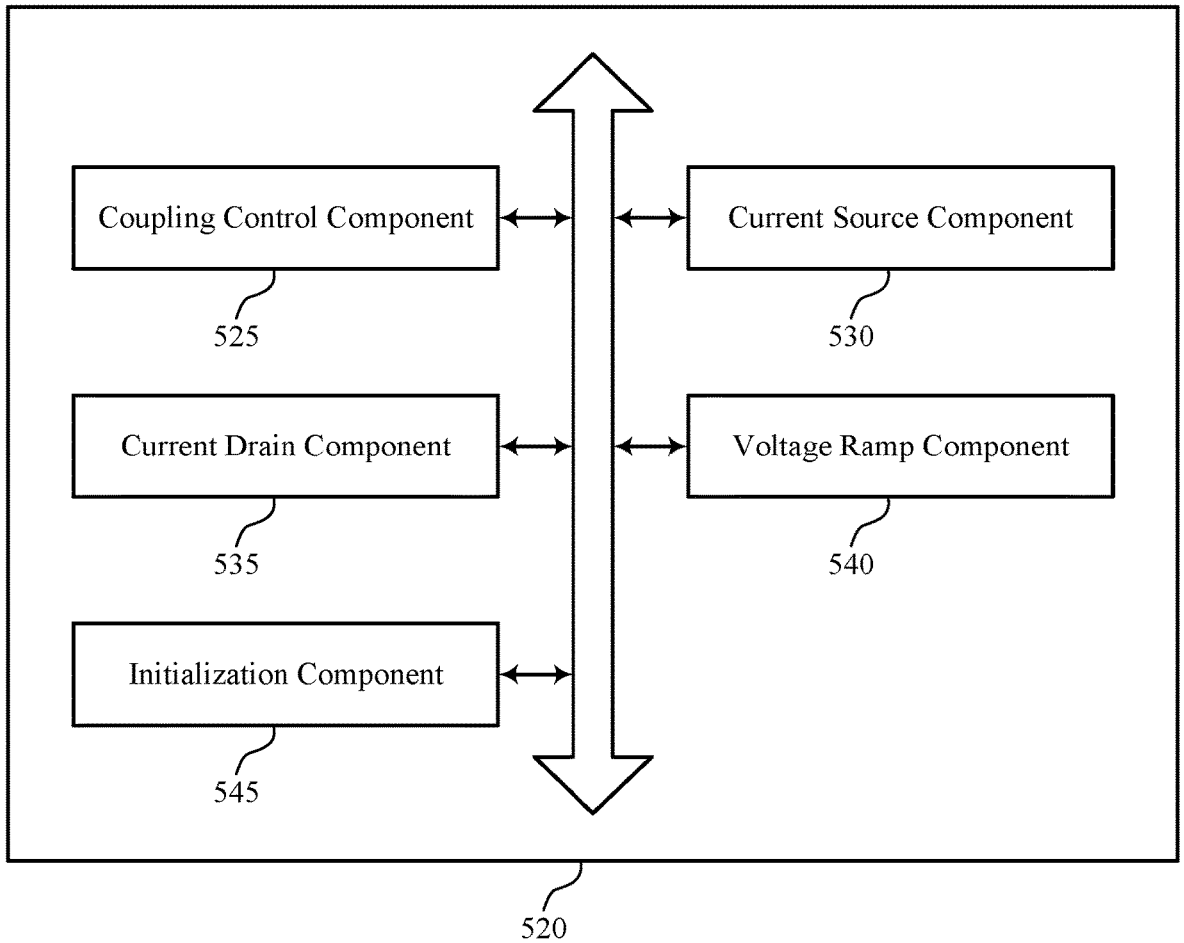
FIG. 5 shows a block diagram of a memory device that supports sensing component with a common node in accordance with examples as disclosed herein.

FIG. 5 shows a block diagram 500 of a memory device 520 that supports sensing component with a common node in accordance with examples as disclosed herein. The memory device 520 may be an example of aspects of a memory device as described with reference to FIGS. 1 through 4. The memory device 520, or various components thereof, may be an example of means for performing various aspects of sensing component with a common node as described herein. For example, the memory device 520 may include a coupling control component 525, a current source component 530, a current drain component 535, a voltage ramp component 540, an initialization component 545, or any combination thereof. Each of these components may communicate, directly or indirectly, with one another (e.g., via one or more buses).

The coupling control component 525 may be configured as or otherwise support a means for coupling a first transistor with a first node of a sense amplifier based at least in part on activating a second transistor coupled with a latch of the sense amplifier, where activating the second transistor is based at least in part on a first state of the latch. The current source component 530 may be configured as or otherwise support a means for supplying a first current to the first transistor based at least in part on activating a third transistor, where the third transistor is coupled with a first bias voltage and the first transistor. The current drain component 535 may be configured as or otherwise support a means for drawing a second current from the first node based at least in part on activating a fourth transistor, where a voltage ramp of the first node is based at least in part on the second current. In some examples, the coupling control component 525 may be configured as or otherwise support a means for activating the first transistor based at least in part on a voltage difference between the first node and a digit line satisfying a threshold, the voltage difference based at least in part on the voltage ramp, where the first transistor causes the latch to switch from the first state to a second state based at least part on the voltage difference between the first node and the digit line satisfying the threshold.

In some examples, the voltage ramp component 540 may be configured as or otherwise support a means for applying a second voltage ramp to a fifth transistor coupled with the first node, where the voltage ramp of the first node is based at least in part on the second voltage ramp.

In some examples, the current source component 530 may be configured as or otherwise support a means for supplying a third current to a terminal of the fifth transistor, where a combined current including the second currents from a plurality of sense amplifiers is supplied by the third current prior to activation of the first transistors of the plurality of sense amplifiers.

In some examples, the voltage ramp component 540 may be configured as or otherwise support a means for initiating the voltage ramp based at least in part on coupling the fourth transistor with a virtual ground voltage via a fifth transistor having a gate coupled with a reference current.

In some examples, the coupling control component 525 may be configured as or otherwise support a means for isolating the first transistor from the first node based at least in part on deactivating the second transistor, where activating the second transistor is based at least in part on switching the latch from the first state to the second state.

In some examples, the initialization component 545 may be configured as or otherwise support a means for initiating the first state of the latch via an activation voltage, where coupling the first transistor with the first node is based at least in part on the initiating.

In some examples, the voltage ramp component 540 may be configured as or otherwise support a means for biasing the first node to an initial voltage of the voltage ramp via a fifth transistor coupled with the initial voltage and the first node. In some examples, the coupling control component 525 may be configured as or otherwise support a means for isolating the first node from the initial voltage based at least in part on applying a signal to a gate of the fifth transistor, where the voltage ramp is based at least in part on drawing the second current from the first node.

Figure 6:
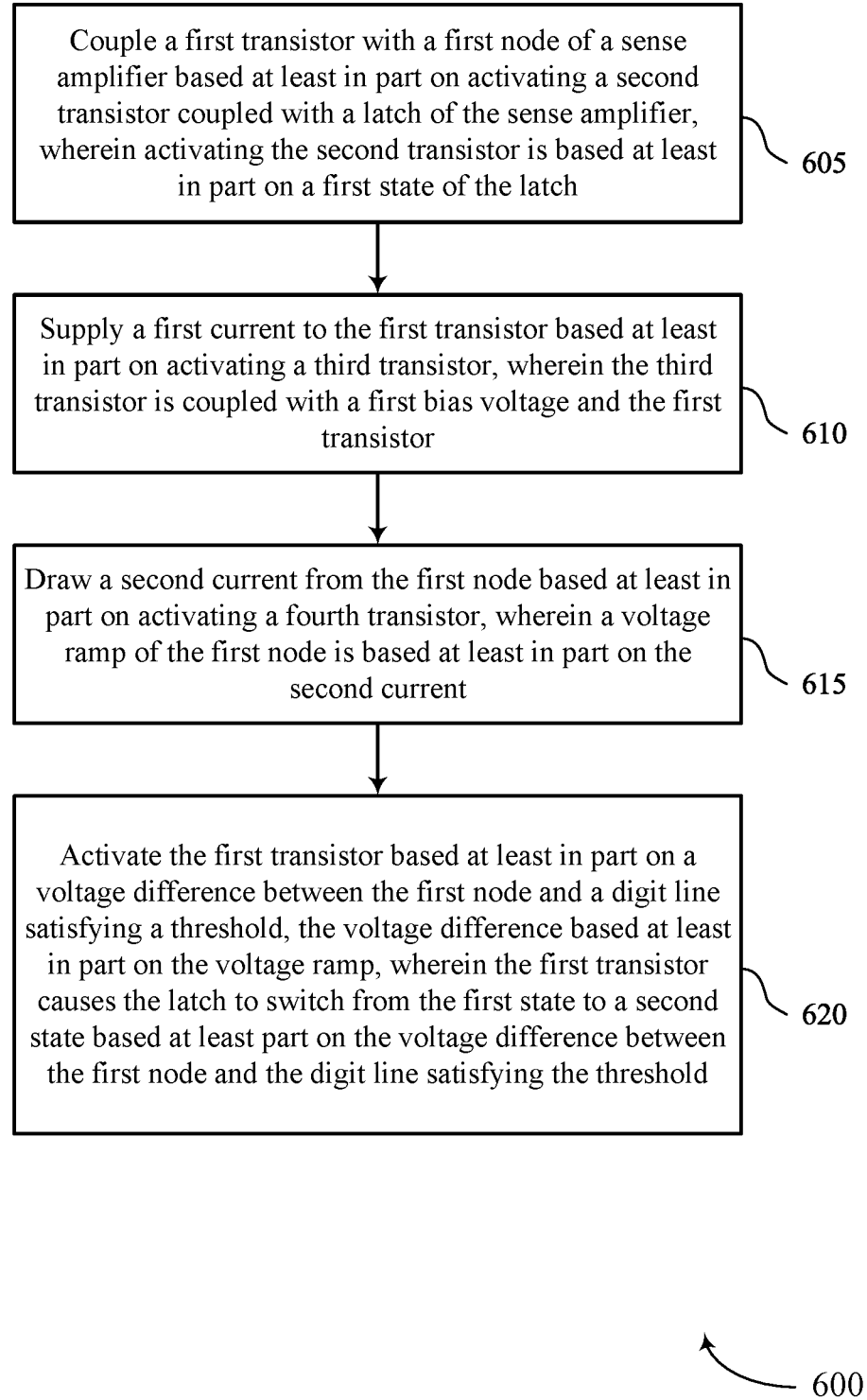
FIG. 6 shows a flowchart illustrating a method or methods that support sensing component with a common node in accordance with examples as disclosed herein.

FIG. 6 shows a flowchart illustrating a method 600 that supports sensing component with a common node in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 605, the method may include coupling a first transistor with a first node of a sense amplifier based at least in part on activating a second transistor coupled with a latch of the sense amplifier, where activating the second transistor is based at least in part on a first state of the latch. The operations of 605 may be performed in accordance with examples as disclosed herein. In some examples, aspects of the operations of 605 may be performed by a coupling control component 525 as described with reference to FIG. 5.

At 610, the method may include supplying a first current to the first transistor based at least in part on activating a third transistor, where the third transistor is coupled with a first bias voltage and the first transistor. The operations of 610 may be performed in accordance with examples as disclosed herein. In some examples, aspects of the operations of 610 may be performed by a current source component 530 as described with reference to FIG. 5.

At 615, the method may include drawing a second current from the first node based at least in part on activating a fourth transistor, where a voltage ramp of the first node is based at least in part on the second current. The operations of 615 may be performed in accordance with examples as disclosed herein. In some examples, aspects of the operations of 615 may be performed by a current drain component 535 as described with reference to FIG. 5.

At 620, the method may include activating the first transistor based at least in part on a voltage difference between the first node and a digit line satisfying a threshold, the voltage difference based at least in part on the voltage ramp, where the first transistor causes the latch to switch from the first state to a second state based at least part on the voltage difference between the first node and the digit line satisfying the threshold. The operations of 620 may be performed in accordance with examples as disclosed herein. In some examples, aspects of the operations of 620 may be performed by a coupling control component 525 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for coupling a first transistor with a first node of a sense amplifier based at least in part on activating a second transistor coupled with a latch of the sense amplifier, where activating the second transistor is based at least in part on a first state of the latch; supplying a first current to the first transistor based at least in part on activating a third transistor, where the third transistor is coupled with a first bias voltage and the first transistor; drawing a second current from the first node based at least in part on activating a fourth transistor, where a voltage ramp of the first node is based at least in part on the second current; and activating the first transistor based at least in part on a voltage difference between the first node and a digit line satisfying a threshold, the voltage difference based at least in part on the voltage ramp, where the first transistor causes the latch to switch from the first state to a second state based at least part on the voltage difference between the first node and the digit line satisfying the threshold.

Aspect 2: The method, apparatus, or non-transitory computer-readable medium of aspect 1, further including operations, features, circuitry, logic, means, or instructions, or any combination thereof for applying a second voltage ramp to a fifth transistor coupled with the first node, where the voltage ramp of the first node is based at least in part on the second voltage ramp.

Aspect 3: The method, apparatus, or non-transitory computer-readable medium of aspect 2, further including operations, features, circuitry, logic, means, or instructions, or any combination thereof for supplying a third current to a terminal of the fifth transistor, where a combined current including the second currents from a plurality of sense amplifiers is supplied by the third current prior to activation of the first transistors of the plurality of sense amplifiers.

Aspect 4: The method, apparatus, or non-transitory computer-readable medium of any of aspects 1 through 3, further including operations, features, circuitry, logic, means, or instructions, or any combination thereof for initiating the voltage ramp based at least in part on coupling the fourth transistor with a virtual ground voltage via a fifth transistor having a gate coupled with a reference current.

Aspect 5: The method, apparatus, or non-transitory computer-readable medium of any of aspects 1 through 4, further including operations, features, circuitry, logic, means, or instructions, or any combination thereof for isolating the first transistor from the first node based at least in part on deactivating the second transistor, where activating the second transistor is based at least in part on switching the latch from the first state to the second state.

Aspect 6: The method, apparatus, or non-transitory computer-readable medium of any of aspects 1 through 5, further including operations, features, circuitry, logic, means, or instructions, or any combination thereof for initiating the first state of the latch via an activation voltage, where coupling the first transistor with the first node is based at least in part on the initiating.

Aspect 7: The method, apparatus, or non-transitory computer-readable medium of any of aspects 1 through 6, further including operations, features, circuitry, logic, means, or instructions, or any combination thereof for biasing the first node to an initial voltage of the voltage ramp via a fifth transistor coupled with the initial voltage and the first node and isolating the first node from the initial voltage based at least in part on applying a signal to a gate of the fifth transistor, where the voltage ramp is based at least in part on drawing the second current from the first node.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 8: An apparatus, including: a memory cell; a sense amplifier coupled with the memory cell via a digit line, the sense amplifier including: a latch; a first transistor having a gate coupled with the digit line, where a first state of the latch couples the first transistor with a first node and a second state of the latch decouples the first transistor from the first node; a second transistor having a gate coupled with a first bias voltage, a terminal of the second transistor coupled with a terminal of the first transistor, where the second transistor is configured to provide a first current; and a third transistor having a first terminal coupled with the first node, where the third transistor is configured to draw a second current from the first node; and a fourth transistor coupled with the sense amplifier and configured to provide a voltage ramp on the first node, where the first transistor is configured to switch the latch from the first state to the second state based at least in part on a voltage difference between the digit line and the first node satisfying a threshold.

Aspect 9: The apparatus of aspect 8, where a gate of the fourth transistor is coupled with a reference voltage configured to provide a second voltage ramp, and the voltage ramp on the first node is based at least in part on the second voltage ramp.

Aspect 10: The apparatus of any of aspects 8 through 9, further including: a fifth transistor coupled with the sense amplifier and configured to bias the first node to an initial voltage of the voltage ramp, where a gate of the fifth transistor is coupled with an activation voltage and a terminal of the fifth transistor is coupled with the initial voltage.

Aspect 11: The apparatus of any of aspects 8 through 10, where the sense amplifier further includes: a fifth transistor having a first terminal coupled with the first transistor, a second terminal coupled with the first node and a gate coupled with the latch, where the fifth transistor is configured to couple the first transistor with the first node based at least in part on the first state of the latch.

Aspect 12: The apparatus of aspect 11, where the fifth transistor is further configured to isolate the first transistor from the first node based at least in part on the latch switching from the first state to the second state.

Aspect 13: The apparatus of any of aspects 8 through 12, where a second terminal of the second transistor is coupled with a supply voltage, and the first current is based at least in part on the supply voltage.

Aspect 14: The apparatus of any of aspects 8 through 13, further including: a fifth transistor coupled with a second terminal of the third transistor and a virtual ground voltage, where the fifth transistor is configured to draw a third current from the third transistor of a plurality of sense amplifiers.

Aspect 15: The apparatus of any of aspects 8 through 14, where the sense amplifier further includes: a fifth transistor coupled having a gate coupled with the terminal of the second transistor and a terminal coupled with a supply voltage, where the fifth transistor is configured to couple a first node of the latch with the supply voltage based at least in part on the voltage difference between the digit line and the first node satisfying the threshold; and a sixth transistor having a gate coupled with an activation voltage and a terminal coupled with the supply voltage, where the sixth transistor is configured to couple a second node of the latch with the supply voltage based at least in part on the activation voltage.

Aspect 16: The apparatus of any of aspects 8 through 15, further including: a fifth transistor having a gate coupled with the first bias voltage, a first terminal coupled with a terminal of the fourth transistor, and a second terminal coupled with a supply voltage.

Aspect 17: The apparatus of any of aspects 8 through 16, where the memory cell includes a volatile memory cell.

Aspect 18: The apparatus of any of aspects 8 through 17, where the memory cell includes a non-volatile memory cell.

An apparatus is described. The following provides an overview of aspects of the apparatus as described herein:

Aspect 19: An apparatus, including: a plurality of memory cells; a plurality of sense amplifiers respectively coupled with the plurality of memory cells via a plurality of digit lines, where each sense amplifier of the plurality of sense amplifiers includes: a latch; a first branch of a plurality of first branches of a differential amplifier, the first branch including a first transistor having a gate coupled with a digit line of the plurality of digit lines and a second transistor having a gate coupled with a first bias voltage, where the second transistor is configured to supply a first current to a terminal of the first transistor, and where a first state of the latch couples the first transistor with a first node and a second state of the latch decouples the first transistor from the first node; and a third transistor having a gate coupled with a second bias voltage and a terminal coupled with the first node, where the third transistor is configured to draw a second current from the first node; and a second branch of the differential amplifier including a fourth transistor having a gate coupled with the first bias voltage and a fifth transistor having a gate coupled with a reference voltage and a terminal coupled with the first nodes of the plurality of sense amplifiers, where, for each sense amplifier, the first transistor is configured to switch the latch from the first state to the second state based at least in part on a voltage ramp on the first node causing a voltage difference between a digit line associated with the each sense amplifier and the first node to satisfy a threshold.

Aspect 20: The apparatus of aspect 19, where the reference voltage is configured to provide a second voltage ramp to the gate of the fifth transistor, and the voltage ramp on the first node is based at least in part on the second voltage ramp.

Aspect 21: The apparatus of any of aspects 19 through 20, where the first node is common to each sense amplifier of the plurality of sense amplifiers.

Aspect 22: The apparatus of aspect 21, further including: a sixth transistor coupled with the first node and configured to bias the first node to an initial voltage of the voltage ramp, where a gate of the sixth transistor is coupled with an activation voltage and a terminal of the sixth transistor is coupled with the initial voltage.

Aspect 23: The apparatus of any of aspects 19 through 22, where each sense amplifier of the plurality of sense amplifiers further includes: a sixth transistor having a first terminal coupled with the first transistor, a second terminal coupled with the first node and a gate coupled with the latch, where the sixth transistor is configured to couple the first transistor with the first node based at least in part on the first state of the latch.

Aspect 24: The apparatus of aspect 23, where the sixth transistor is further configured to isolate the first transistor from the first node based at least in part on the latch switching from the first state to the second state.

Aspect 25: The apparatus of any of aspects 19 through 24, where a plurality of states stored in the plurality of memory cells are a balanced codeword.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a memory cell;
a sense amplifier coupled with the memory cell via a digit line, the sense amplifier comprising:
a latch;
a first transistor having a gate coupled with the digit line, wherein a first state of the latch couples the first transistor with a first node and a second state of the latch decouples the first transistor from the first node;
a second transistor having a gate coupled with a first bias voltage, a terminal of the second transistor coupled with a terminal of the first transistor, wherein the second transistor is configured to provide a first current; and
a third transistor having a first terminal coupled with the first node, wherein the third transistor is configured to draw a second current from the first node; and
a fourth transistor coupled with the sense amplifier and configured to provide a voltage ramp on the first node, wherein the first transistor is configured to switch the latch from the first state to the second state based at least in part on a voltage difference between the digit line and the first node satisfying a threshold.

2. The apparatus of claim 1, wherein
a gate of the fourth transistor is coupled with a reference voltage configured to provide a second voltage ramp, and
the voltage ramp on the first node is based at least in part on the second voltage ramp.

3. The apparatus of claim 1, further comprising:
a fifth transistor coupled with the sense amplifier and configured to bias the first node to an initial voltage of the voltage ramp, wherein a gate of the fifth transistor is coupled with an activation voltage and a terminal of the fifth transistor is coupled with the initial voltage.

4. The apparatus of claim 1, wherein the sense amplifier further comprises:
a fifth transistor having a first terminal coupled with the first transistor, a second terminal coupled with the first node and a gate coupled with the latch, wherein the fifth transistor is configured to couple the first transistor with the first node based at least in part on the first state of the latch.

5. The apparatus of claim 4, wherein the fifth transistor is further configured to isolate the first transistor from the first node based at least in part on the latch switching from the first state to the second state.

6. The apparatus of claim 1, wherein
a second terminal of the second transistor is coupled with a supply voltage, and
the first current is based at least in part on the supply voltage.

7. The apparatus of claim 1, further comprising:
a fifth transistor coupled with a second terminal of the third transistor and a virtual ground voltage, wherein the fifth transistor is configured to draw a third current from the third transistor of a plurality of sense amplifiers.

8. The apparatus of claim 1, wherein the sense amplifier further comprises:
a fifth transistor coupled having a gate coupled with the terminal of the second transistor and a terminal coupled with a supply voltage, wherein the fifth transistor is configured to couple a first node of the latch with the supply voltage based at least in part on the voltage difference between the digit line and the first node satisfying the threshold; and a sixth transistor having a gate coupled with an activation voltage and a terminal coupled with the supply voltage, wherein the sixth transistor is configured to couple a second node of the latch with the supply voltage based at least in part on the activation voltage.

9. The apparatus of claim 1, further comprising:
a fifth transistor having a gate coupled with the first bias voltage, a first terminal coupled with a terminal of the fourth transistor, and a second terminal coupled with a supply voltage.

10. The apparatus of claim 1, wherein the memory cell comprises a volatile memory cell.

11. The apparatus of claim 1, wherein the memory cell comprises a non-volatile memory cell.

12. An apparatus, comprising:
a plurality of memory cells;
a plurality of sense amplifiers respectively coupled with the plurality of memory cells via a plurality of digit lines, wherein each sense amplifier of the plurality of sense amplifiers comprises:
a latch;
a first branch of a plurality of first branches of a differential amplifier, the first branch comprising a first transistor having a gate coupled with a digit line of the plurality of digit lines and a second transistor having a gate coupled with a first bias voltage, wherein the second transistor is configured to supply a first current to a terminal of the first transistor, and wherein a first state of the latch couples the first transistor with a first node and a second state of the latch decouples the first transistor from the first node; and
a third transistor having a gate coupled with a second bias voltage and a terminal coupled with the first node, wherein the third transistor is configured to draw a second current from the first node; and
a second branch of the differential amplifier comprising a fourth transistor having a gate coupled with the first bias voltage and a fifth transistor having a gate coupled with a reference voltage and a terminal coupled with the first nodes of the plurality of sense amplifiers, wherein, for each sense amplifier, the first transistor is configured to switch the latch from the first state to the second state based at least in part on a voltage ramp on the first node causing a voltage difference between a digit line associated with the each sense amplifier and the first node to satisfy a threshold.

13. The apparatus of claim 12, wherein
the reference voltage is configured to provide a second voltage ramp to the gate of the fifth transistor, and
the voltage ramp on the first node is based at least in part on the second voltage ramp.

14. The apparatus of claim 12, wherein the first node is common to each sense amplifier of the plurality of sense amplifiers.

15. The apparatus of claim 14, further comprising:
a sixth transistor coupled with the first node and configured to bias the first node to an initial voltage of the voltage ramp, wherein a gate of the sixth transistor is coupled with an activation voltage and a terminal of the sixth transistor is coupled with the initial voltage.

16. The apparatus of claim 12, wherein each sense amplifier of the plurality of sense amplifiers further comprises:
a sixth transistor having a first terminal coupled with the first transistor, a second terminal coupled with the first node and a gate coupled with the latch, wherein the sixth transistor is configured to couple the first transistor with the first node based at least in part on the first state of the latch.

17. The apparatus of claim 16, wherein the sixth transistor is further configured to isolate the first transistor from the first node based at least in part on the latch switching from the first state to the second state.

18. The apparatus of claim 12, wherein a plurality of states stored in the plurality of memory cells are a balanced codeword.

19. A method, comprising:
coupling a first transistor with a first node of a sense amplifier based at least in part on activating a second transistor coupled with a latch of the sense amplifier, wherein activating the second transistor is based at least in part on a first state of the latch;
supplying a first current to the first transistor based at least in part on activating a third transistor, wherein the third transistor is coupled with a first bias voltage and the first transistor;
drawing a second current from the first node based at least in part on activating a fourth transistor, wherein a voltage ramp of the first node is based at least in part on the second current; and
activating the first transistor based at least in part on a voltage difference between the first node and a digit line satisfying a threshold, the voltage difference based at least in part on the voltage ramp, wherein the first transistor causes the latch to switch from the first state to a second state based at least part on the voltage difference between the first node and the digit line satisfying the threshold.

20. The method of claim 19, further comprising:
applying a second voltage ramp to a fifth transistor coupled with the first node, wherein the voltage ramp of the first node is based at least in part on the second voltage ramp.

21. The method of claim 20, further comprising:
supplying a third current to a terminal of the fifth transistor, wherein a combined current comprising the second currents from a plurality of sense amplifiers is supplied by the third current prior to activation of the first transistors of the plurality of sense amplifiers.

22. The method of claim 19, further comprising:
initiating the voltage ramp based at least in part on coupling the fourth transistor with a virtual ground voltage via a fifth transistor having a gate coupled with a reference current.

23. The method of claim 19, further comprising:
isolating the first transistor from the first node based at least in part on deactivating the second transistor, wherein activating the second transistor is based at least in part on switching the latch from the first state to the second state.

24. The method of claim 19, further comprising:
initiating the first state of the latch via an activation voltage, wherein coupling the first transistor with the first node is based at least in part on the initiating.

25. The method of claim 19, further comprising:
biasing the first node to an initial voltage of the voltage ramp via a fifth transistor coupled with the initial voltage and the first node; and
isolating the first node from the initial voltage based at least in part on applying a signal to a gate of the fifth transistor, wherein the voltage ramp is based at least in part on drawing the second current from the first node.

* * * * *